United States Patent [19]

Yamada et al.

[11] Patent Number: 4,893,174

[45] Date of Patent: Jan. 9, 1990

[54] HIGH DENSITY INTEGRATION OF SEMICONDUCTOR CIRCUIT

[75] Inventors: Minoru Yamada, Iruma; Akira Masaki, Musashino; Kazuo Sato; Yutaka Harada, both of Tokyo, all of Japan

[73] Assignee: Hitachi, Ltd., Tokyo, Japan

[21] Appl. No.: 240,443

[22] Filed: Sep. 2, 1988

Related U.S. Application Data

[63] Continuation of Ser. No. 883,529, Jul. 8, 1986, abandoned.

[30] Foreign Application Priority Data

Jul. 8, 1985 [JP] Japan ................................. 60-148393
Jul. 10, 1985 [JP] Japan ................................. 60-150100

[51] Int. Cl.$^4$ ..................... H01L 25/04; H01L 29/06; H01L 23/16
[52] U.S. Cl. .......................................... 357/82; 357/49; 357/51; 357/55; 357/68; 357/75; 357/84; 357/88
[58] Field of Search ..................... 357/82, 55, 49, 80, 357/51, 81, 71, 68, 75, 88

[56] References Cited

U.S. PATENT DOCUMENTS

| | | | |
|---|---|---|---|
| 4,225,900 | 9/1980 | Ciccio et al. | 357/80 |
| 4,437,109 | 3/1984 | Anthony et al. | 357/55 |
| 4,471,369 | 9/1984 | Anthony et al. | 357/26 |
| 4,507,673 | 3/1985 | Aoyama et al. | 357/23.15 |
| 4,523,211 | 6/1985 | Morimoto et al. | 357/49 |
| 4,537,654 | 8/1985 | Berenz et al. | 357/41 |
| 4,567,542 | 1/1986 | Shimada et al. | 357/51 |
| 4,631,636 | 12/1986 | Andrews | 357/82 |
| 4,754,319 | 6/1988 | Shito et al. | 357/80 |

FOREIGN PATENT DOCUMENTS 56-2662 1/1981 Japan ................................. 357/51

OTHER PUBLICATIONS

Wu, "Wafer Structure Permitting Distribution from the Back Side of Wafer", IBM Technical Disclosure Bulletin, vol. 16, No. 9, Feb. 1974.
Madgo, "Pyramid Shaped Electrical Feed Through in Silicon Wafers", IBM Technical Disclosure Bulletin, vol. 19, No. 4, Sep. 1976.

*Primary Examiner*—William D. Larkins
*Assistant Examiner*—Ngan Van Ngo
*Attorney, Agent, or Firm*—Antonelli, Terry & Wands

[57] ABSTRACT

An integrated circuit is disclosed in which a plurality of semiconductor substrates are stacked in such a manner that an insulating board, provided with (1) structure, such as grooves, for transmitting a coolant so as to dissipate heat, and (2) an electrical interconnection member for electrically connecting adjacent semiconductor substrates, is sandwiched between semiconductor substrates. In order to attain the high-speed signal transmission between a semiconductor substrate and an insulating board, a signal current flows not only in a main surface of the semiconductor substrate but also in directions perpendicular to the main surface. The insulating board may be formed of an insulating silicon carbide plate which has a plurality of grooves filled with a metal.

41 Claims, 4 Drawing Sheets

FIG. 1
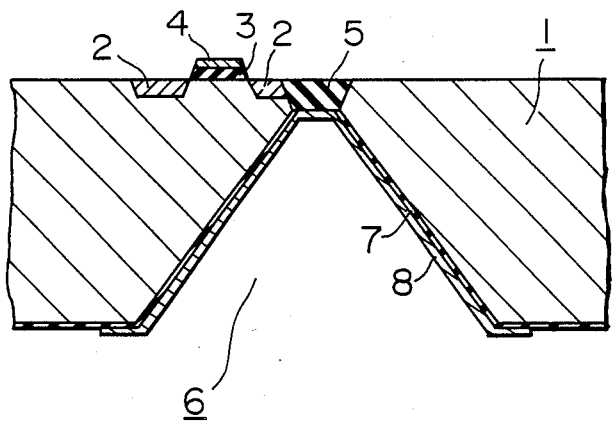
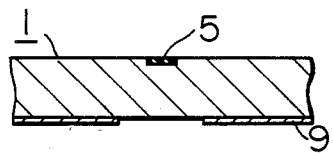
FIG. 2A
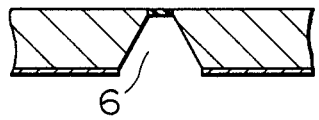
FIG. 2B
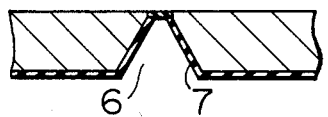
FIG. 2C
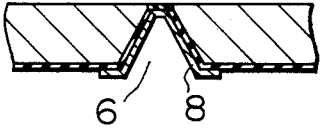
FIG. 2D

HIGH DENSITY INTEGRATION OF SEMICONDUCTOR CIRCUIT

This application is a continuation of application Ser. No. 883,529, filed July 8, 1986 abandoned.

BACKGROUND OF THE INVENTION

1. Field of the Invention

The present invention relates to the high density packaging of semiconductor integrated circuits, and more particularly a structure suitable for use in the packaging of wafer-scale semiconductor IC (namely, integrated circuit) substrates, that is, in the so-called wafer stack packaging, and a method of fabricating the same.

2. Description of the Related Art

An increase in integration density of a semiconductor integrated circuit does not only reduce the volume thereof but also decreases a signal delay time, and thus can greatly improve the performance of the semiconductor integrated circuit.

Further, a wafer-scale IC substrate is required to have a large number of input/output signal electrodes. Accordingly, it is important to provide the signal electrodes not only in the peripheral portion of an upper surface of the substrate where circuit elements are arranged, but also on the lower surface (namely, the back surface) of the substrate. In this case, electrical through holes are indispensable for the electrical connection between the upper and lower surfaces. The formation process of a through hole of this kind usually includes steps of boring a hole through the substrate, and forming a conductive layer on the wall of the hole. Anisotropic etching is a typical one of the methods for boring a hole through a silicon substrate. This method is described in an article entitled "Silicon as a Mechanical Material" by K. E. Petersen (Proceedings of IEEE, Vol. 70, No. 5, 1982).

Further, in order to provide conductors which penetrate through a silicon wafer and serve as members connecting the upper and lower surfaces of the substrate, in the substrate at high distribution density, a method has been devised in which aluminum liquid drops are moved across the silicon substrate by thermal migration so that the substrate is provided with recrystallized regions doped with aluminum at a multiplicity of regions, and such aluminum-doped regions are used as the connecting members. In this method, however, the resistance of each aluminum-doped region is as high as several ohms, and the electrical insulation between aluminum-doped regions is not good, as described in the above-referred article.

The so-called wafer stack structure in which a plurality of wafer-scale silicon substrates each provided with an integrated circuit, that is, wafer-scale IC substrates are stacked, is a very important means capable of enhancing the packing density. In such a structure, a wiring method in which a signal is taken out from an IC substrate in a direction perpendicular thereto and is sent to the next IC substrate in this direction, is the most effective method for reducing the total length of wiring conductors. The above wiring method has been carried out by Grinsberg et al, in such a manner that a metal bridge is formed on a substrate, and the substrate is mechanically connected to another substrate through the bridge. (Refer to an article entitled "A Cellular VLSI Architecture", IEEE Trans. Computer, Vol. C-33, No. 1, 1984, pages 69 through 81). The structure thus obtained includes a plurality of wafer-scale IC substrates which are stacked without paying any attention to the cooling of the substrates, and is effective only for a case where each substrate has a small number of connecting terminals. In a case where large-area substrates each having a large number of connecting terminals are stacked, it is very difficult to keep electrical contact between all corresponding connecting terminals of adjacent substrates, and to dissipate heat generated by integrated circuits.

SUMMARY OF THE INVENTION

It is an object of the present invention to provide a substrate structure suitable for forming an ultra-high density integration circuit, and a method of fabricating the substrate structure.

It is another object of the present invention to provide a method of forming through holes in a semiconductor IC substrate at high distribution density.

It is a further object of the present invention to provide an insulating board which has compact cooling/interconnecting means and is suited for use in a wafer stack structure, and a method of fabricating the insulating board.

In a wafer stack structure, it is desirable that a signal current flows not only on each substrate but also into the substrate in directions perpendicular thereto and moreover an inter-substrate signal current flows in the above directions. According to the present invention, a signal path which pierces a semiconductor substrate from the upper surface to the lower surface thereof, is readily formed by utilizing a surface region doped with an impurity and by using anisotropic etching techniques. A plurality of such semiconductor substrates are assembled through insulating boards each provided with a signal path and a coolant path for dissipating heat.

In more detail, there is provided a method of forming a through hole capable of electrically connecting that upper surface of a monocrystalline silicon substrate where circuit elements are formed, with the lower surface of the substrate, which method comprises the steps of forming a highly-doped region at a portion of a circuit element, and boring a hole from the lower surface at a position just under the highly-doped region through anisotropic etching techniques so that the hole reaches the highly-doped region. When a silicon substrate is subjected to anisotropic etching, the etching rate is dependent upon the impurity concentration of the substrate. For example, in a case where an aqueous solution containing ethylene diamine and pyrocatechol is used as an etchant, the etching rate for a silicon layer whose boron content is not less than $7 \times 10^{19}$ cm$^{-3}$ is substantially equal to zero. Accordingly, when a hole is bored into the silicon substrate from the lower surface thereof by using the above etchant, the boron-doped layer acts as the etching stoppage layer. Thus, when boron-doped regions are used as, for example, the source and drain regions of a P-channel MOS transistor formed in the upper surface of a silicon substrate, through holes for electrically connecting the source and drain regions with the lower surface of the substrate can be readily formed.

In a wafer stack structure, tens of hundreds of wafer-scale IC substrates are stacked, and each substrate includes hundred thousands of gates, generates a heat quantity of hundreds of watts, and is provided with thousands of input/output signal lines. Accordingly, it is desirable to make compact the cooling and interconnecting means for each IC substrate. A plurality of large-area IC substrates each having one side equal to, for example, 100 mm are used in a large-scale computer. In order to connect a pair of such IC substrates electrically at more than a thousand positions, it is desirable to interpose a connecting member between the substrates. The connecting member can be formed of an insulating board including a multiplicity of conductors which pierce the board in the direction of the thickness of the board. Preferably, the connecting member is provided with a coolant path for passing a coolant through the connecting member, to remove heat generated by the integrated circuit of each substrate. As mentioned above, according to the present invention, a plurality of wafer-scale IC substrates are not stacked directly, but are stacked in such a manner than an insulating board (namely, the connecting member) in which cooling and interconnecting means are incorporated, is sandwiched between adjacent IC substrates. The insulating board is formed of an insulating member for defining a groove therein to use the groove as a coolant path, and a plurality of conductive portions are provided in the insulating member so that the conductive portions are electrically insulated from each other and each conductive portion connects the upper surface of the insulating board electrically with the lower surface thereof. The conductive portions are uniform in chemical composition.

A method of fabricating such an insulating board in accordance with the present invention, comprises the steps of: forming a conductive member piercing an insulating substrate; forming a coolant flowing groove in the insulating substrate; and dividing the conductive member into parts to form a plurality of conductive portions each connecting the upper surface of the insulating substrate electrically with the lower surface thereof. Preferably, the insulating board is fabricated in the following manner. That is, an insulating plate is used as a starting member. A plurality of first grooves are cut from the upper surface of the insulating plate so as to be parallel to each other, and a plurality of second grooves are cut from the lower surface of the insulating plate so as to be parallel to each other and to intersect with the first grooves, or a plurality of holes are bored from the lower surface of the insulating plate so as to intersect or meet with the first grooves. Next, the grooves and holes are filled with a conductive material, and thus conductive members piercing the insulating plate are formed. Thereafter, a plurality of grooves are formed in at least a surface including a striped pattern of conductive member, in directions perpendicular or at an angle to the striped pattern, to separate each conductive member into a plurality of conductive portions which pierce the insulating plate and are independent of each other, and to form a coolant path for cooling the conductive portions.

When an insulating board is fabricated in the above-mentioned manner, a multiplicity of independent conductive portions each used for connecting confronting electrode pads of two semiconductor IC substrates, can be formed in the insulating board at high distribution density, and a coolant path for passing a coolant to remove heat generated by the integrated circuit of each substrate can also be provided at a high distribution density.

BRIEF DESCRIPTION OF THE DRAWINGS

FIG. 1 is a fragmentary sectional view showing a semiconductor IC substrate having through holes.

FIGS. 2A to 2D are fragmentary sectional views showing a process for forming the through hole of FIG. 1.

DESCRIPTION OF THE PREFERRED EMBODIMENTS

Figure 3:
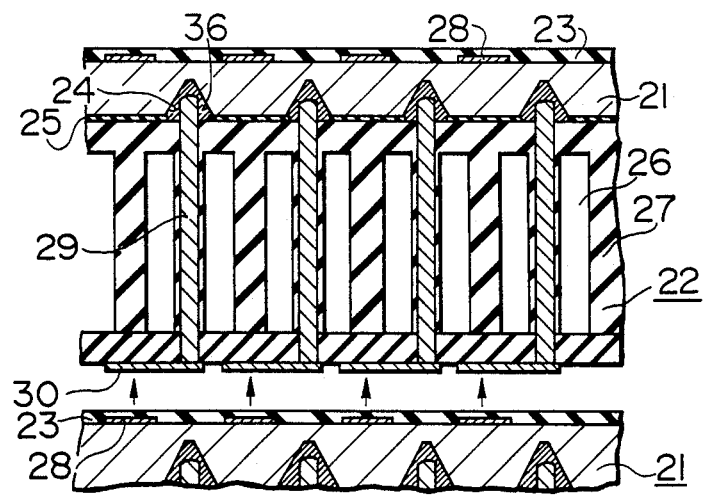
FIG. 3 is a fragmentary sectional view showing an embodiment of a wafer stack structure which includes an insulating board and is fabricated in accordance with the present invention.

In a case where an integrated circuit is formed on a wafer-scale semiconductor substrate and/or a multiplicity of wafer-scale semiconductor IC substrates are stacked, it is desirable to form an electric path which pierces the semiconductor substrate in the direction of the thickness thereof. Further, it is desirable to stack a plurality of semiconductor IC substrates in such a manner that an insulating board is sandwiched between adjacent IC substrates, and to form an electric path which pierces the insulating board in the direction of the thickness thereof. Furthermore, in order to dissipate heat generated by an integrated circuit, it is desirable to provide a coolant path in an IC substrate stack.

Now, explanation will be made of the electric path piercing the semiconductor substrate and the insulating board and the electric path piercing the insulating board. It is to be noted that the term "through hole" herein includes not only a hole which pierces a substrate completely, but also a via hole which has a depth slightly smaller than the thickness of the substrate.

FIG. 1 is a fragmentary sectional view showing a wafer-scale IC substrate having an electric conductor which pierces the substrate between a pair of main surfaces thereof. Referring to FIG. 1, an IC substrate is formed of a monocrystalline silicon plate having (100) crystallographic orientation. Although CMOS transistor elements, the wiring thereof, and an insulating, protective film are formed on one of the main surfaces (that is, the upper surface) of the substrate 1, only a P-channel MOS transistor is shown in FIG. 1, and other parts and members are omitted from FIG. 1. The P-channel MOS transistor includes a boron-diffused layer 2 and 5 which serves as source and drain regions, an $SiO_2$ film 3 serving as a gate insulating film, a polysilicon layer 4 serving as a gate electrode. Part of the boron-diffused layer is a highly-doped layer 5 which is doped with boron so as to have an impurity concentration of about $3 \times 10^{19}$ cm$^{-3}$ or more and serves not only as the source of drain region but also as the stopper of anisotropic etching, which will be explained later.

A through hole 6 is bored from the other main surface (that is, the lower surface) of the substrate 1 so as to reach the highly-doped layer 5. In other words, the through hole 6 does not reach the upper surface of the substrate 1, but the bottom of the hole 6 is formed of the highly-doped layer 5. The through hole 6 is coated with a conductive layer 8 through a dielectric film 7, which electrically insulates the conductive layer 8 from the substrate 1. For example, the substrate 1 has a thickness of 400 μm, the highly-doped, boron-diffused layer 5 has a thickness of 2 μm and a size of 30 μm square at the upper surface of the substrate 1, the through hole 6 has a size of 20 μm square at the bottom thereof and a size of 590 μm square at the lower surface of the substrate 1, the dielectric film 7 is formed of an $SiO_2$ film having a thickness of 10 μm, and the conductive layer 8 has a thickness of 3 μm and is made of aluminum or others. The etched (111) surface is inclined about 55° from the (100) surface.

FIGS. 2A to 2D are sectional views showing an embodiment of a method of forming the through hole of FIG. 1. Although circuit elements, the wiring thereof, an insulating, protective film and others are formed on the substrate 1 through well-known techniques, only the highly-doped, boron-diffused layer 5 serving as the etching stopper is shown in FIGS. 2A to 2D. First, as shown in FIG. 2A, an $SiO_2$ film 9 having a thickness of about 1 μm is formed on the lower surface of the substrate 1 by the sputtering method, and that portion of the $SiO_2$ film 9 which corresponds to the through hole 6, is removed through well-known etching techniques. Next, as shown in FIG. 2B, anisotropic etching is carried out for the (100) plane of the substrate 1 while using the $SiO_2$ film 9 as a mask. The anisotropic etching is carried out at 115° C. for about 10 hours, by using an etchant which contains 17 ml of ethylene diamine, 3 g of pyrocatechol and 8 ml of water or the same composition. The etching action is substantially stopped at the highly-doped, boron-diffused layer 5. Thus, a desired hole 6 reaching the layer 5 can be readily formed. Then, as shown in FIG. 2C, the $SiO_2$ film 7 is formed all over the lower surface of the substrate 1 including the exposed surface of the hole 6, by the sputtering method, and that portion of the $SiO_2$ film 7 which is formed on the highly-doped layer 5, is removed through well-known etching techniques. Finally, a metal 8 such as aluminum is deposited all over the lower surface of the substrate 1, and the remaining portion of the deposited metal other than the metal existing within and in the neighborhood of the hole 6, is etched out, as shown in FIG. 2D. Alternatively, the metal may be selectively deposited only on a portion which exists in the neighborhood of the hole 6 and includes the hole 6.

In FIG. 2C, a polymer film made of the Parylene (trade name), which is manufactured by Union Carbide Co., may be formed in place of the $SiO_2$ film 7. Further, in FIG. 2D, a composite layer based upon the deposition of Ti, Ni, Au or others may be formed in place of the aluminum layer 8. When the hole 6 is filled with a metal having a low melting point such as solder, the conductive layer 8 can be readily bonded to a connecting pin of another substrate.

As explained above, according to the present embodiment, a through hole can be readily formed which is connected directly with a circuit element formed on the surface of a semiconductor IC substrate, and moreover such through holes can be formed at high distribution density.

FIG. 3 shows a case where the through hole of the IC substrate shown in FIG. 1 is filled with a metal having a low melting point to form a connecting terminal, which is connected to another IC substrate through an insulating board. The insulating board includes a cooling fin to act as a heat-dissipating member, and also includes an electrically conductive member which is provided in the cooling fin so as to connect the upper and lower surfaces of the insulating board electrically.

Referring to FIG. 3, two semiconductor IC substrates 21 are disposed on and under an insulating board 22 provided with cooling and interconnecting means. A wafer stack structure can be formed by stacking a multiplicity of pairs each made up of one semiconductor IC substrate 21 and one insulating board 22, and by pressing the above pairs onto each other. Further, desired circuit elements, electrode pads 28 for input/output signals, and an insulating film 23 are formed on the upper surface of the substrate 21, and through holes 24 are formed in the lower surface of the substrate 21. Additionally, the wiring for connecting the circuit elements, the electrode pads 28 and the through holes 24 is formed on the upper surface of the substrate 21. The circuit elements and the wiring are omitted from FIG. 3, for the sake of simplicity.

A great portion of the insulating board 22 is formed of a cooling block (namely, a cooling fin) 27 having a coolant path 26 therein. The lower surface of the SiC body is covered with an insulating protective coating, such as sputtered $SiO_2$ and PSG. The cooling block 27 is made of silicon carbide which is thermally conductive and electrically insulative. Such electrically insulating SiC may be BeO-added sintered SiC. Copper pins 29 pierce block 27 at predetermined positions, and are connected with electrode pads 30 formed on the lower surface of the block 27. Cooling fluid such as water, air, or Fluorinert (trade name) manufactured by Minnesota M. & M. Co. flows in the coolant path 26.

The copper pin 29 of the insulating board 22 is put into the through hole 24 of the substrate 21, and then fixed to the hole 24 by a metal 36 which is previously bonded to the hole 24 and has a low melting point. At this time, heat conductive grease 25 such as silicone grease is interposed between the substrate 21 and the insulating board 22, to reduce the heat resistance therebetween. The electrically insulative silicon carbide for making the cooling block 27 may be the Hitaceram (trade mark) manufactured by Hitachi Co., Ltd. Alternatively, ceramics such as alumina and mullite, or silicon nitride may be used instead of silicon carbide.

A desired wafer stack structure can be formed by stacking a multiplicity of pairs, each made up of the substrate 21 and the insulating board 22 and by pressing the pairs onto each other. At this time, the electrode pad 30 of the insulating board 22 and the electrode pad 28 of that substrate 21 which is disposed under the insulating board 22, confront each other, through insulating layer 23 and make up a capacitor (insulating layer 23 being the dielectric of the capacitor).

For example, the substrate 21 has a size of 100 mm square and a thickness of 0.4 mm, the insulating board 22 has a size of 100 mm square and a height of 1.5 mm, the coolant path 26 has a width of 0.5 mm, the wall of the cooling block 27 has a thickness of 0.5 mm, the copper pin 29 has a diameter of 0.3 mm and a height of 1.7 mm, an area where the electrode pads 28 and 30 confront each other is equal to $0.6^2$ mm$^2$. The capacitor made up of the electrode pads 28 and 30 has a capacitance of about 1 pF, and the copper pins 29 are arranged at intervals of 2 mm in longitudinal and transverse directions, to make it possible to connect 2500 signal lines of the upper substrate 21 to 2500 signal lines of the lower substrate 21 through the insulating board 22.

Heat generated on the substrate 21 is transmitted to the cooling fluid through the heat conductive grease 25 and the cooling block 27. This path has a heat resistance less than 0.05° C/W, and hence can withstand heat generation of hundreds of watts on the substrate 21.

The substrate 21 can be readily detached from the insulating board 22. Accordingly, when a fault occurs in an integrated circuit formed on the substrate 21, a countermeasure can be readily taken.

A signal pulse from the substrate 21 is transmitted to the adjacent substrate through the through hole 24, the copper pin 29 and the capacitor made up of the electrode pads 28 and 30. The signal transmission system using capacitive coupling is described in detail, in Japanese Patent Application Unexamined Publication No. 56-2662, which is hereby incorporated by reference.

Figure 4:
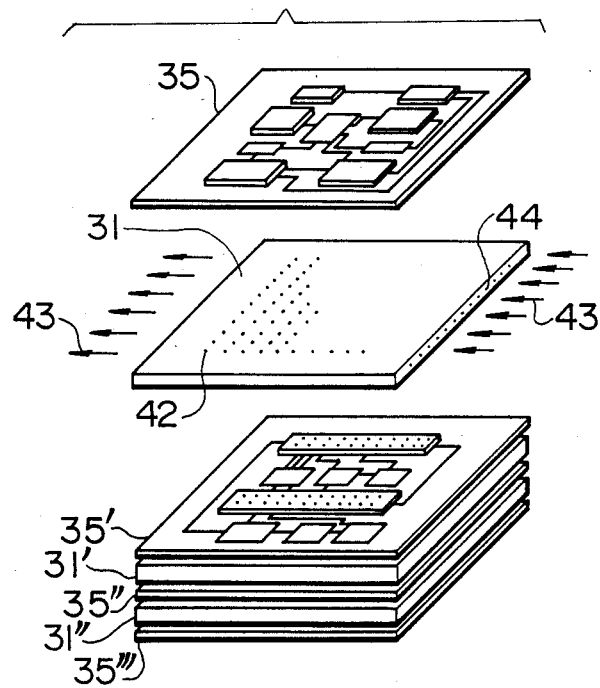
FIG. 4 is a perspective view showing the whole of a wafer stack structure according to the present invention.

FIG. 4 shows the whole construction of a wafer stack structure which uses the semiconductor IC substrate and insulating board shown in FIG. 3. In FIG. 4, reference numerals 31, 31' and 31" designate insulating boards according to the present invention, 42 a conductive pin, 43 cooling fluid, 44 a coolant path, and 35, 35', 35" and 35''' semiconductor IC substrates. The wafer stack structure can be obtained by stacking the substrate 35, 35', 35" and 35''' and the insulating board 31, 31' and 31", and by pressing these members onto each other.

Figure 5A:
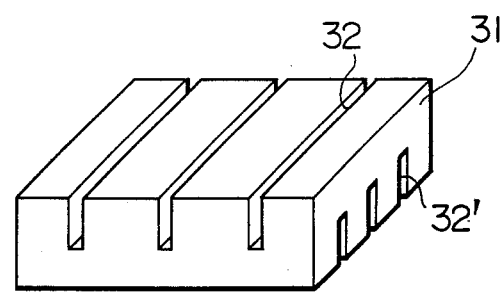
FIGS. 5A to 5C are perspective views showing the fabricating process of an embodiment of an insulating board according to the present invention.
Figure 5B:
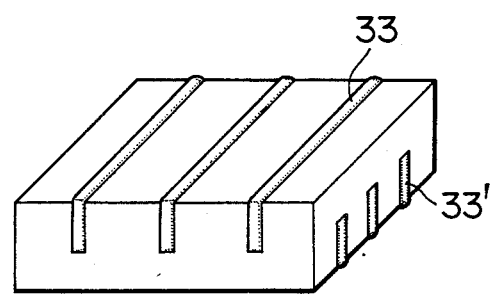
Figure 5C:
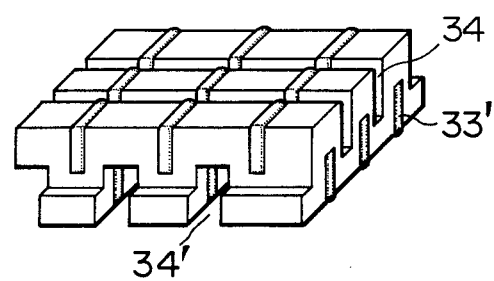

FIGS. 5A to 5C are enlarged perspective views of a portion of an embodiment of an insulating board according to the present invention, for explaining the fabricating process of the embodiment. A silicon carbide plate having a thickness of, for example, 0.5 mm is used for forming the present embodiment.

First, as shown in FIG. 5A, grooves 32 each having a depth of 0.26 mm and a width of 0.08 mm are cut from the upper surface of a silicon carbide plate 31 so as to be parallel to each other and to be arranged at an interval of 0.5 mm. The grooves 32 can be readily cut by using a grinding wheel. Further, grooves 32' having the same size and arrangement as the grooves 32 are cut from the lower surface of the plate 31 so as to be perpendicular to or crossing with the grooves 32 and to intersect with the grooves 32 in the central plain of the plate 31 in the direction of the thickness thereof. Thus, holes piercing the plate 31 are formed at positions where the grooves 32 intersect with the grooves 32'. Thus, through holes are formed in the plate 31 at intervals of 0.5 mm in longitudinal and transverse directions, that is, are arranged in the form of a square matrix.

Next, as shown in FIG. 5B, the grooves 32 and 32' are filled with a conductive material. Metal plating is utilized in a typical method for filling the grooves 32 and 32' with a conductive material. For example, gold is evaporated, and the upper and lower surfaces of the plate 31 and exposed to evaporated gold. Then, gold deposited on the upper and lower surfaces are removed without removing gold deposited on the wall of each groove. Thereafter, chromium plating is carried out while using the remaining gold as an electrode. Thus, the grooves 32 and 32" are filled with chromium (that is, conductive members). The conductive members 33 filling up the grooves 32 intersect with the conductive members 33' filling up the grooves 32". Thus, conductive members piercing the plate 31 can be formed.

Next, as shown in FIG. 5C, the conductive members 33 formed on the upper surface side are cut by grooves 34 perpendicular to or at an angle to the conductive members 33 and the conductive members 33' formed on the lower surface side are cut by grooves 34' perpendicular to or at an angle to the conductive members 33', to obtain conductive portions which are arranged in the form of a square matrix and are electrically independent of each other. It is needless to say that the depth of the grooves 34 and 34' is made larger than the depth of the grooves 32 and 32', but is made smaller than the thickness of the plate 31. For example, the grooves 34 have a depth of 0.28 mm and a width of 0.1 mm, and are formed at intervals of 0.5 mm. Further, the grooves 34 are formed so as to be spaced apart from the grooves 32' which have been formed in the lower surface of the plate 31, in the direction preferably perpendicular to the grooves 32'. For example, the grooves 34 and 32' are arranged at intervals of 0.25 mm in the direction perpendicular to these grooves. Further, the grooves 34' are formed in a manner similar to the above-mentioned. As a result, conductive members which are independent of and separated from each other, are arranged in the plate 31 at intervals of 0.5 mm in longitudinal and transverse directions, and a coolant path for dissipating heat generated by an integrated circuit is formed of the grooves 34 and 34'.

The grooves 34 and 34' in the above state can be used as the coolant path. However, in order to insulate the above conductive members from each other more surely, it is preferable to coat the walls of the grooves 34 and 34' with a polymer film.

In the present embodiment, it is not always required to make constant the depth and width of groove and the distance between adjacent grooves. Further, it is not necessary to make the arrangement of grooves in the lower surface of the plate 31 similar to that in the upper surface.

Figure 6A:
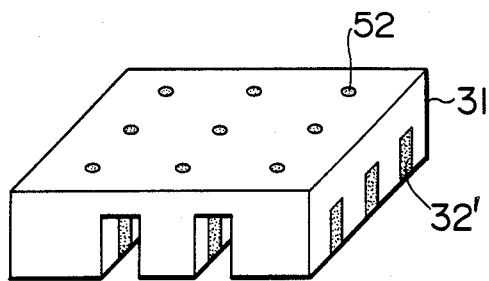
FIGS. 6A and 6B are perspective views showing another embodiment of an insulating board according to the present invention.
Figure 6B:
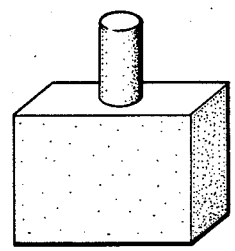

FIGS. 6A and 6B show another embodiment of an insulating board according to the present invention. The present embodiment can be fabricated in the following manner. This is, in the step shown in FIG. 5A, only the grooves 32' are cut from the lower surface of a plate 31, and holes 52 each having diameter of 0.08 mm are bored from the upper surface of the plate. In many cases, it is very difficult to bore a cylindrical hole through a plate whose thickness is far greater than the diameter of the cylindrical hole. However, when grooves are cut from the lower surface of the plate and holes are bored from the upper surface thereof to the grooves, holes piercing the plate can be readily formed. Thereafter, the grooves and the holes are filled with a conductive material in the same manner as the embodiment shown in FIGS. 5A to 5C, and then each of the conductive members filling up the grooves is separated by grooves into a plurality of parts, as shown in FIG. 6A. Thus, conductive portions which are independent of and separated from each other, are arranged in the plate in the form of a matrix. Each of the conductive portions thus obtained has such a form as shown in FIG. 6B.

In these embodiments, 10,000 conductive portions which pierce an insulating plate, are formed in that portion of the insulating plate which has an area of 50 mm × 50 mm. The resistance of each conductive portion between the upper and lower surfaces of the insulating plate is less than $10^{-2}$ $\Omega$, and is far smaller than the resistance of a conductive portion which pierces a silicon wafer and is formed by aluminum migration. Further, in these embodiments, the coolant path is kept in contact with the conductive portions, and hence can produce a remarkable cooling effect.

In the above, the embodiment of FIGS. 5A to 5C and the embodiment of FIGS. 6A and 6B have been explained. However, these embodiments are shown only by way of example, and an insulating board according to the present invention is not limited to such embodiments.

Each of the above-mentioned insulating boards has compact cooling/interconnecting means, and can be used for stacking semiconductor IC substances, each of which generates a heat quantity of hundreds of watts and is provided with thousands of input/output signal lines.

Further, in an insulating board according to the present invention, conductive portions each piercing a highly insulative plate and having a resistance less than $10^{-2} \Omega$ are formed at high distribution density, and a coolant path for dissipating heat generated by an electric circuit is also arranged at high distribution density. Accordingly, an insulating board according to the present invention can be effectively used for increasing the scale and capacity of a computer which makes use of the wafer scale integrated circuits.

We claim:

1. An integrated circuit structure formed by stacking a plurality of semiconductor substrates, in a thickness direction, in such a manner that an insulating board is sandwiched between adjacent semiconductor substrates, wherein a semiconductor substrate and an insulating board have substantially the same size; wherein said insulating board includes a coolant path, in said insulating board, said coolant path including a groove in the insulating board for passing a coolant therethrough, the groove being provided by walls formed in the insulating board; and wherein both the semiconductor substrate and the insulating board include a plurality of electrical communication paths which respectively pierce said semiconductor substrate and the insulating board in the thickness direction, said electrical communication paths piercing the semiconductor substrate including a conductive member provided in an anisotropic etch pit which is formed in the semiconductor substrate, said semiconductor substrate having first and second main surfaces, opposite to each other in said thickness direction, said conductive member provided in said anisotropic etch pit electrically connecting the first main surface of the semiconductor substrate, where a circuit element is formed, to the second main surface of the semiconductor substrate, said pit being made by a process including the step of boring a hole under a highly-doped layer which is part of said circuit element, from the second main surface of said semiconductor substrate to said highly-doped layer, by an anisotropic etching method, and the electrical communication paths piercing the insulating board including conductive portions extending on the walls, providing the groove, formed in the insulating board.

2. An integrated circuit structure formed by stacking a plurality of semiconductor substrates, in a thickness direction; in such a manner that an insulating board is sandwiched between adjacent semiconductor substrates, the insulating board having first and second main surfaces, opposite to each other in the thickness direction, wherein a semiconductor substrate and an insulating board have substantially the same size, wherein the insulating board includes therein a coolant path, said coolant path including a groove, in the insulating board, for passing a coolant therethrough, the groove being provided by walls formed in said insulating board; and wherein both the semiconductor substrate and the insulating board include a plurality of electrical communication paths which respectively pierce said semiconductor substrate and the insulating board in the thickness direction, said electrical communication paths piercing said semiconductor substrate including a conductive member provided in an anisotropic etch pit which is formed in said semiconductor substrate, and said electrical communication paths piercing said insulating board including a plurality of conductive portions insulated electrically from each other for providing an electrical connection between the first and second main surfaces of said insulating board, the plurality of conductive portions being provided on the walls, providing the groove, formed in the insulating board.

3. An integrated circuit structure formed by stacking a plurality of semiconductor substrates, in a thickness direction, in such a manner than an insulating board is sandwiched between adjacent semiconductor substrates, wherein a semiconductor substrate and an insulating board have substantially the same size; wherein said insulating board includes a coolant path, in said insulating board, said coolant path including a groove in the insulating board for passing a coolant therethrough, the groove being provided by walls formed in the insulating board; and wherein the semiconductor substrate and the insulating board include a plurality of electrical communication paths which respectively pierce said semiconductor substrate and said insulating board in the thickness direction, electrical communication paths piercing the semiconductor substrate including a conductive member provided in an anisotropic etch pit which is formed in the semiconductor substrate, said conductive member provided in said anisotropic etch pit electrically connecting a first main surface, of first and second main surfaces of the semiconductor substrate, where a circuit element is formed, to the second main surface of the semiconductor substrate, said pit being made by a process including the step of boring a hole under a highly-doped layer which is part of said circuit element, from the second main surface of said semiconductor substrate to said highly-doped layer, by an anisotropic etching method, said pit extending from the second main surface of the semiconductor substrate to said highly doped layer without extending entirely through the thickness of the semiconductor substrate, and said conductive member provided in said anisotropic etch pit is in electrical contact with said highly doped layer, the conductive member and highly doped layer providing an electrical communication path piercing the semiconductor substrate in the thickness direction, and said electrical communication paths piercing the insulating board including conductive portions extending on the walls, providing the groove, formed in the insulating board.

4. An integrated circuit structure formed by stacking a plurality of semiconductor substrates, in a thickness direction, in such a manner that an insulating board is sandwiched between adjacent semiconductor substrates, wherein a semiconductor substrate and an insulating board have substantially the same size; wherein said insulating board includes a coolant path, in said insulating board, said coolant path includes a groove in the insulating board for passing a coolant therethrough, the groove being provided by walls formed in the insulating board; and wherein both the semiconductor substrate and the insulating board include a plurality of electrical communication paths which respectively pierce said semiconductor substrate and the insulating board in the thickness direction, said electrical communication paths piercing the semiconductor substrate including a conductive member provided in an anisotropic etch pit which is formed in the semiconductor substrate, the semiconductor substrates each having upper and lower main surfaces opposite to each other in the thickness direction, and the plurality of electrical communication paths which pierce the semiconductor substrate in the direction of the thickness thereof extending from the upper main surface to the lower main surface, and said electrical communication paths piercing the insulating board including conductive portions extending on the walls, providing the groove, formed in the insulating board.

5. An integrated circuit structure formed by stacking a plurality of semiconductor substrates, in a thickness direction, in such a manner that an insulating board is sandwiched between adjacent semiconductor substrates, wherein a semiconductor substrate and an insulating board have substantially the same size; wherein said insulating board includes a coolant path, in said insulating board, said coolant path including a groove in the insulating board for passing a coolant therethrough, the groove being provided by walls formed in the insulating board; and wherein both the semiconductor substrate and the insulating board include a plurality of electrical communication paths which respectively pierce the semiconductor substrate and the insulating board in the thickness direction, the electrical communication paths piercing the semiconductor substrate including a conductive member provided in an anisotropic etch pit which is formed in the semiconductor substrate, the plurality of electrical communication paths which pierce the semiconductor substrate in the thickness direction each including a highly doped layer and the conductive member, the conductive member extending in the pit formed in the semiconductor substrate in the thickness direction thereof, the pit not extending completely through the semiconductor substrate, the conductive member being in electrical contact with said highly doped layer, and said electrical communication paths piercing the insulating board including conductive portions extending on the walls, providing the groove, formed in the insulating board.

6. An integrated circuit structure formed by stacking a plurality of semiconductor substrates, in a thickness direction, in such a manner that an insulating board is sandwiched between adjacent semiconductor substrates, wherein a semiconductor substrate and an insulating board have substantially the same size; wherein both the semiconductor substrate and the insulating board include a plurality of electrical communication paths which respectively pierce said semiconductor substrate and the insulating board in the thickness direction, the electrical communication path piercing the semiconductor substrate including a conductive member provided in an anisotropic etch pit which is formed in the semiconductor substrate, each semiconductor substrate and insulating board having first and second main surfaces opposite to each other in the thickness direction, and the plurality of electrical communication paths piercing the semiconductor substrate in the direction of the thickness thereof extending from the first main surface of the semiconductor substrate to the second main surface thereof, and the electrical communication paths piercing the insulating board including conductive portions; and wherein said insulating board includes electrodes on one of the first and second surfaces of the insulating board, the electrodes being electrically isolated from each other and respectively connected electrically to said conductive portions; and wherein said electrodes of said insulating board, and electrodes provided on one of the first and second surfaces of each of the semiconductor substrates, form capacitors when said insulating board and an adjacent semiconductor substrate are stacked.

7. An integrated circuit structure formed by stacking a plurality of semiconductor substrates, in a thickness direction, in such a manner that an insulating board is sandwiched between adjacent semiconductor substrates; wherein a semiconductor substrate and an insulating board have substantially the same size; wherein both the semiconductor substrate and the insulating board include a plurality of electrical communication paths which respectively pierce the semiconductor substrate and the insulating board in the thickness direction, the electrical communication paths piercing the semiconductor substrate including a conductive member provided in an anisotropic etch pit which is formed in the semiconductor substrate, the plurality of electrical communication paths which pierce the semiconductor substrate each including a highly doped layer and the conductive member, the conductive member extending in the pit formed in the semiconductor substrate in the thickness direction, the pit not extending completely through the semiconductor substrate, the conductive member being in electrical contact with said highly-doped layer, and the electrical communication paths piercing the insulating board including conductive portions; and wherein said insulating board includes electrodes on one of the first and second surfaces of the insulating board, the electrodes being electrically isolated from each other and respectively connected electrically to said conductive portions; and wherein said electrodes of said insulating board, and electrodes provided on one of the first and second surfaces of each of the semiconductor substrates, form capacitors when said insulating board and an adjacent semiconductor substrate are stacked.

8. An integrated circuit structure according to claim 5, wherein said conductive member provided in said anisotropic etch pit includes a metal member which has a low melting point and fills up said anisotropic etch pit.

9. An integrated circuit structure according to claim 1, wherein said coolant path includes a plurality of parallel paths provided at regular intervals.

10. An integrated circuit structure according to claim 1, wherein both ends of said electrical communication paths piercing said insulating board are different from each other in the shape of cross section.

11. An integrated circuit structure according to claim 10, wherein said electrical communication paths piercing said insulating board have a first rectangular cross section at one end and has a second rectangular cross section at the other end, and a lengthwise direction of said first rectangular cross section makes an angle with that of said second rectangular cross section.

12. An integrated circuit structure according to claim 10, wherein said electrical communication paths piercing said insulating board have a rectangular cross section at one end and has a circular cross section at the other end.

13. An integrated circuit structure according to claim 10, wherein said plurality of electrical communication paths piercing said insulating board are uniform in chemical composition.

14. An integrated circuit structure according to claim 2, wherein said insulating board includes electrodes which are insulated electrically from each other and connected electrically with said conductive portions, which electrodes are arranged on one of said main surfaces of said insulating board.

15. An integrated circuit structure according to claim 14, wherein said electrodes of said insulating board, and electrodes formed on each of said semiconductor substrates, make up capacitors when said insulating board and said semiconductor substrate are stacked.

16. An integrated circuit structure according to claim 2, wherein said insulating board is made of a material which has high thermal conductivity and is electrically insulative.

17. An insulating board according to claim 2, wherein said insulating board is made of silicon carbide which has high thermal conductivity and is electrically insulative.

18. An integrated circuit structure according to claim 6, wherein said first and second main surfaces of said semiconductor substrate are substantially parallel to a (100) crystallographic plane.

19. An integrated circuit structure according to claim 3, wherein said highly-doped layer is doped with boron.

20. An integrated circuit structure according to claim 3, wherein said highly-doped layer has an impurity concentration of $10^{19} cm^{-3}$ or more.

21. An integrated circuit structure according to claim 3, wherein said highly-doped layer is part of one of the source region and drain region of a P-channel MOS transistor.

22. An integrated circuit structure according to claim 3, further comprising a thick protective film on the second main surface of said semiconductor substrate, said thick protective film having been formed before said hole is bored from the second main surface of said semiconductor substrate.

23. An integrated circuit structure according to claim 4, wherein the plurality of electrical communication paths which pierce the semiconductor substrate in the thickness direction each include a highly doped layer and the conductive member, the conductive member extending in the pit formed in the semiconductor substrate in the thickness direction, the pit not extending completely through the semiconductor substrate, the conductive member being in electrical contact with said highly doped layer.

24. An integrated circuit structure according to claim 5, wherein said conductive member fills said pit.

25. An integrated circuit structure according to claim 24, wherein said conductive member filling said pit is a metal having a low melting point.

26. An integrated circuit structure according to claim 5, wherein a heat conductive grease is provided between adjacent semiconductor substrates and insulating boards.

27. An integrated circuit structure according to claim 1, said structure including a plurality of circuit elements provided on one of the plurality of semiconductor substrates, with electrical connections to said plurality of circuit elements being provided by said plurality of electrical communication paths which respectively pierce the semiconductor substrate and the insulating board in the direction of thickness thereof.

28. An integrated circuit structure according to claim 27, wherein the plurality of circuit elements provided on said one of the semiconductor substrates are connected electrically by wiring, so as to form an integrated circuit.

29. An integrated circuit structure according to claim 27, wherein said plurality of circuit elements include CMOS transistor elements.

30. An integrated circuit structure according to claim 1, wherein the semiconductor substrate is a silicon substrate.

31. An integrated circuit structure according to claim 2, further comprising a plurality of circuit elements formed on one of the plurality of semiconductor substrates, said plurality of circuit elements being connected by wiring, with further connections to said plurality of circuit elements by way of said plurality of electrical communication paths which respectively pierce the semiconductor substrate and the insulating board in the thickness direction.

32. An integrated circuit structure according to claim 3, further comprising a plurality of circuit elements formed on one of the plurality of semiconductor substrates, said plurality of circuit elements being connected by wiring, with further connections to said plurality of circuit elements by way of said plurality of electrical communication paths which respectively pierce the semiconductor substrate and the insulating board in the thickness direction.

33. An integrated circuit structure according to claim 4, further comprising a plurality of circuit elements formed on one of the plurality of semiconductor substrates, said plurality of circuit elements being connected by wiring, with further connections to said plurality of circuit elements by way of said plurality of electrical communication paths which respectively pierce the semiconductor substrate and the insulating board in the thickness direction.

34. An integrated circuit structure according to claim 5, further comprising a plurality of circuit elements formed on one of the plurality of semiconductor substrates, said plurality of circuit elements being connected by wiring, with further connections to said plurality of circuit elements by way of said plurality of electrical communication paths which respectively pierce the semiconductor substrate and the insulating board in the thickness direction.

35. An integrated circuit structure according to claim 1, wherein said hole is a hole bored only part way through the thickness direction of the semiconductor substrate, from said second main surface of said semiconductor substrate to said highly-doped layer, and wherein said conductive member is provided in said hole to provide electrical connection from said second main surface of said highly-doped layer.

36. A integrated circuit structure according to claim 23, wherein said pit, which does not extend completely through the semiconductor substrate, extends to said highly doped layer, the conductive member extending in the pit so as to contact the highly doped layer.

37. An integrated circuit structure according to claim 36, wherein each said highly doped layer extends in the thickness direction from the upper main surface of the semiconductor substrate toward the lower main surface of the semiconductor substrate, but not completely through the semiconductor substrate in the thickness direction, and each said pit extends from the lower main surface of the semiconductor substrate.

38. An integrated circuit structure according to claim 1, wherein said insulating board includes electrodes on a surface of the insulating board, the electrodes being electrically isolated from each other and respectively connected electrically to said conductive portions; and wherein said electrodes of said insulating board, and electrodes provided on each of the semiconductor substrates, form capacitors when said insulating board and an adjacent semiconductor substrate are stacked.

39. An integrated circuit structure according to claim 3, wherein said insulating board includes electrodes on a surface of the insulating board, the electrodes being electrically isolated from each other and respectively connected electrically to said conductive portions; and wherein said electrodes of said insulating board, and electrodes provided on each of the semiconductor substrates, form capacitors when said insulating board and an adjacent semiconductor substrate are stacked.

40. An integrated circuit structure according to claim 4, wherein said insulating board includes electrodes on a surface of the insulating board, the electrodes being electrically isolated from each other and respectively connected electrically to said conductive portions; and wherein said electrodes of said insulating board, and electrodes provided on each of the semiconductor substrates, form capacitors when said insulating board and an adjacent semiconductor substrate are stacked.

41. An integrated circuit structure according to claim 5, wherein said insulating board includes electrodes on a surface of the insulating board, the electrodes being electrically isolated from each other and respectively connected electrically to said conductive portions; and wherein said electrodes of said insulating board, and electrodes provided on each of the semiconductor substrates, form capacitors when said insulating board and an adjacent semiconductor substrate are stacked.

* * * * *